United States Patent [19]

Nagata et al.

[11] Patent Number: 5,327,808
[45] Date of Patent: Jul. 12, 1994

[54] METHOD FOR THE PREPARATION OF A FRAME-SUPPORTED PELLICLE FOR PHOTOLITHOGRAPHY

[75] Inventors: Yoshihiko Nagata; Yuichi Hamada; Meguru Kashida; Yoshihiro Kubota, all of Gunma, Japan

[73] Assignee: Shin-Etsu Chemical Co., Ltd., Tokyo, Japan

[21] Appl. No.: 63,853

[22] Filed: May 18, 1993

[30] Foreign Application Priority Data

May 25, 1992 [JP] Japan .................................. 4-157534

[51] Int. Cl.⁵ ............................................... B26D 7/10
[52] U.S. Cl. ............................................ 83/861; 83/16; 83/171; 83/914; 156/267
[58] Field of Search .................. 83/16, 171, 914, 651.1, 83/861; 156/250, 267, 344

[56] References Cited

U.S. PATENT DOCUMENTS

| | | | |
|---|---|---|---|
| 2,646,494 | 7/1953 | Fegan | 83/171 |
| 4,414,872 | 11/1983 | Bard et al. | 83/171 |
| 4,779,497 | 10/1988 | Lee | 156/267 X |

Primary Examiner—Eugenia Jones
Attorney, Agent, or Firm—McAulay Fisher Nissen Goldberg & Kiel

[57] ABSTRACT

A process for the preparation of a frame-supported pellicle membrane used for dust-proof protection of a photomask in the photolithographic patterning work of, for example, semiconductor devices. An improvement is proposed for trimming of a pellicle membrane formed on a base plate and adhesively bonded to a pellicle frame to remove the extraneous portion of the membrane protruded out of the pellicle frame. Instead of the mechanical punching method for trimming, the trimming work according to the invention is performed by using a cutting device having a cutter element heated at a temperature higher than the melting point of the thermoplastic resin forming the membrane so that the membrane is trimmed by melting of the resin. Different from the conventional mechanical punching method, the trimming process of the invention is free from the problem of occurrence of dust particles deposited on the membrane to adversely affect the quality of the pattern reproduction.

3 Claims, 1 Drawing Sheet

METHOD FOR THE PREPARATION OF A FRAME-SUPPORTED PELLICLE FOR PHOTOLITHOGRAPHY

BACKGROUND OF THE INVENTION

The present invention relates to a method for the preparation of a frame-supported pellicle for photolithography or, more particularly, a frame-supported pellicle used in photolithography for dust-proof protection of a photomask in the manufacture of semiconductor devices such as LSIs, VLSIs and the like and liquid-crystal display units in a procedure of pattern-wise exposure to light having a wavelength of 500 nm or shorter.

As is well known, a process of photolithographic patterning is involved in the manufacture of various kinds of electronic devices including semiconductor devices such as LSIs, VLSIs and the like as well as liquid crystal display units, in which a semiconductor silicon wafer or a base plate for liquid crystal display units is exposed pattern-wise to light through a transparency of a photomask bearing the desired fine pattern. One of the serious problems in this photolithographic process is that sometimes dust particles are deposited on the photomask to greatly affect the quality of the pattern which should be a high-fidelity reproduction of the pattern on the photomask.

Needless to say, the photolithographic patterning works are usually conducted in a clean room but the above mentioned problem due to deposition of dust particles on the photomask cannot be completely solved even by working in a clean room of highest cleanness. Accordingly, a method proposed in this regard is that a frame-supported pellicle, which is a highly transparent membrane of a plastic resin, is mounted on the photomask and the photolithographic pattern-wise light-exposure is conducted through the pellicle membrane which serves as a dust-proof protector for the photomask.

Since the frame-supported pellicle is used for the dust-proof protection of the photomask, it is a matter of course that the pellicle is absolutely free from dust particles or foreign materials deposited thereon although it is an extremely difficult matter to ensure perfect cleanness of a pellicle without deposition of foreign materials by a variety of reasons leading to the occurrence of particles including the particles floating in the atmosphere of the manufacturing line and clean room, particles contained in the pure water used for rinse and the like and particles contained in the starting materials of the pellicle membrane per se and in the adhesive used for adhesive bonding of the pellicle membrane and the frame supporting the membrane.

It is understood that the process of mechanical working for the preparation of the pellicle membrane is the most responsible for the occurrence of dust particles. For example, a frame-supported membrane is prepared usually by adhesively bonding a separately prepared pellicle membrane to a rigid frame followed by trimming of the membrane to cut off the extraneous portion of the membrane protruded out of the frame. When this trimming work of the membrane is conducted by using a bladed cutter or a punch, tiny fragments of the plastic resin film are unavoidably formed and eventually deposited on the pellicle membrane and pellicle frame. Once such foreign particles are deposited on the membrane, it is almost impossible to subsequently remove them. Another problem in the above mentioned mechanical trimming work is that, since the trimming work is conducted on a pellicle membrane which is formed on a substrate plate by the method of casting of a solution of the plastic resin thereon and the like, the substrate plate is eventually damaged by the trimming punch or other cutting tools for the mechanical trimming work.

In view of the above described disadvantages in the mechanical trimming method of pellicle membranes, a proposal is made for the use of a laser beam which in principle cuts off the pellicle membrane by melting the thermoplastic resin film forming the pellicle membrane so that the problem of occurrence of cutting debris or dust particles can be solved, which may otherwise be unavoidably deposited on the pellicle membrane. The trimming method by using a laser beam, however, is not free from a serious problem. Namely, pellicle membranes are required to be suitable for use in the photolithography in which the light for pattern-wise exposure is the i-line or an excimer laser beam of very short wavelengths. This means that the pellicle membrane is necessarily formed from a thermoplastic resin having high transmissivity to a short wavelength light down to the so-called vacuum ultraviolet such as the KrF and ArF excimer laser beams having a wavelength of 248 nm and 193 nm, respectively. Accordingly, the pellicle membrane formed from such a resin having high transmissivity to the laser beam hardly absorbs the energy of the laser beam used for the trimming work of the pellicle membrane such as the beams from YAG lasers or above mentioned excimer lasers so that laser beams are not suitable for the trimming work. Even if a pellicle membrane could be trimmed by using a laser beam, another problem in the use of a laser beam is that the substrate plate, on which the pellicle membrane is formed and supports the membrane during the trimming work, made from fused quartz glass or silicon would also be damaged by the laser beam. Therefore, the only practical method used for the trimming work of pellicle membrane is the mechanical method despite the problems that the method is accompanied by a decrease in the quality of the pellicle membrane as well as in the yield of acceptable products.

SUMMARY OF THE INVENTION

The present invention accordingly has an object to provide a novel method for the trimming work of a pellicle membrane supported on a base plate, on which the same is formed, and adhesively bonded to a pellicle frame to remove the extraneous portion of the membrane protruded out of the frame, by which the above mentioned disadvantages and problems in the prior art methods can be eliminated.

Thus, the present invention provides an improvement which comprises, in the process of trimming of a pellicle membrane made from a thermoplastic resin supported on a base plate, on which the membrane has been formed, and adhesively bonded to a pellicle frame to remove the portion of the membrane protruded out of the pellicle frame, by cutting the membrane along the pellicle frame, cutting the membrane along the pellicle frame by melting with a cutting device consisting of a cutter frame and a cutter element held on the lower end of the cutter frame, which is heated at a temperature higher than the melting point of the thermoplastic resin forming the pellicle membrane and brought into contact with the membrane so that trimming of the pellicle membrane is effected by melting.

DETAILED DESCRIPTION OF THE PREFERRED EMBODIMENTS

As is described above, the most characteristic feature in the trimming work of a pellicle membrane according to the inventive improvement consists in the use of a cutting device having a cutter element which is heated at a temperature higher than the melting point of the thermoplastic resin forming the pellicle membrane so that the pellicle membrane is trimmed not by mechanical punching but by melting of the membrane along the outer surface of the pellicle frame to which the pellicle membrane is adhesively bonded. This trimming method is absolutely free from the troubles due to occurrence of particles of the membrane which is unavoidable when the membrane is trimmed by a mechanical punching method. Moreover, the base plate of fused silica glass or silicon, on which the pellicle membrane has been formed by the casting method of a resin solution and the like and which supports the pellicle membrane during the trimming work, is free from the troubles of damage unavoidable when the trimming work is conducted by using a laser beam.

As is known, a pellicle membrane of a transparent thermoplastic resin is formed usually on a base plate of, for example, fused silica glass or silicon by casting a solution of the resin thereon followed by the removal of the solvent to dryness. The thus formed membrane is, without peeling off from the base plate, adhesively bonded to a rigid pellicle frame and the extraneous portion of the membrane protruded out of the pellicle frame is removed by cutting along the outer surface of the pellicle frame so as to finish a trimmed pellicle membrane before the membrane is separated from the base plate on which it has been formed.

In contrast to the conventional method in which the trimming work of the pellicle membrane in the above described process is performed by punching to mechanically cut off the extraneous part of the pellicle membrane protruded out of the pellicle frame, the inventive method is characterized by the use of a cutting device which is heated at a temperature higher than the melting point of the thermoplastic resin forming the pellicle membrane which is cut not mechanically but by melting so that the otherwise unavoidable problem of dust particle formation can be completely solved.

Figure 1:
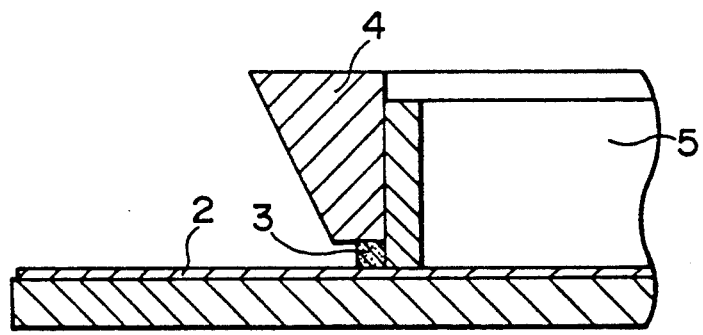
FIG. 1 is a schematic illustration of the cutting device on a pellicle membrane under trimming by a vertical cross sectional view.
Figure 2A:
FIGS. 2a and 2b are an elevational side view and a plan view of the cutting device, respectively.
Figure 2B:
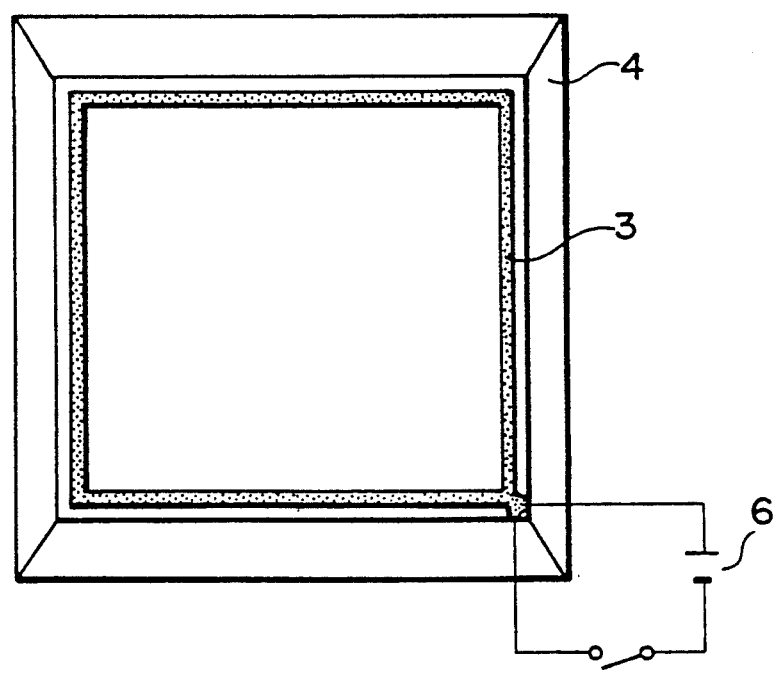

FIG. 1 of the accompanying drawing is given for the illustration of the above described trimming work according to the invention by a schematic vertical cross sectional view of the assembly under working including a pellicle membrane 2 formed on a base plate 1 and adhesively bonded to a pellicle frame 5 and a cutting device consisting of a cutter frame 4 and a cutter element 3 held by the cutter frame 4 on the lower surface thereof. FIGS. 2a and 2b are an elevational side view and a plan view, respectively, of the cutting device consisting of a cutter frame 4 and a cutter element 3 held by the cutter frame 4 on the lower surface thereof. The cutter element 3 in itself is a frame made from a wire having an appropriate electric resistance connected to the terminals of a power source 6 so that the wire frame 3 serves as a heater element capable of being heated up to a temperature higher than the melting point of the thermoplastic resin forming the pellicle membrane 2. An alternative way to heat the cutter blade 3 is to provide the cutter frame 4 with a heating means built therein and the cutter element 3 is heated by the heat conduction from the thus heated cutter frame 4. It is important that the cutter frame 4 and the cutter element 3 each have an inside dimension just to fit with the outer dimension of the pellicle frame 5 so that the trimming work of the pellicle membrane 2 can be as complete as possible leaving substantially no extraneous portions of the membrane protruded out of the pellicle frame 5.

The material of the cutter frame 4 of the cutting device is required that it can impart the frame 4 with a mechanical strength sufficient to withstand the cutting operation and is never responsible to the occurrence of dust particles. Further, the cutter frame 4 also must be free from the troubles of deformation or fusion even when the cutter element 3, which can be a resistance heater element, is heated to an elevated temperature higher than the melting point of thermoplastic resin of the pellicle membrane 2. Examples of a suitable material for the cutter frame 4 include stainless steel, aluminum and the like.

On the other hand, the cutter element 3 to serve as a heater element is required that no dust particles are formed therefrom and the base plate 1 supporting the pellicle membrane 2 under trimming is never damaged thereby even when the cutter element 3 is in direct contact with the base plate 1. Suitable materials for the cutter element 3 include metals having a relatively high electric resistance such as nickel-chromium alloys, platinum, tungsten, molybdenum and the like and certain ceramic materials such as silicon carbide and the like, of which nickel-chromium alloys and platinum are preferred.

When the trimming work of the pellicle membrane 2 is performed by using the above described cutting device according to the invention, the temperature of the cutter element 3 must be higher than the melting point of the thermoplastic resin forming the pellicle membrane 2 to be trimmed since the membrane 2 is cut by melting in contact with the cutter element 3 although the temperature of the cutter element 3 must not exceed the softening temperature of the base plate 1 supporting the pellicle membrane 2 under the trimming work. Further, it is preferable when the trimming work of a number of pellicle membranes is performed one by one that the cutter element 3 is heated intermittently in synchronization with the up and down movement of the cutting device in such a manner that the cutter element 3 is at the heated stage in the interval of contacting with the pellicle membrane 2. When the heating interval of the cutter element 3 is too short, no reliability in trimming can be ensured while, when the heating interval of the cutter element 3 is too long, excessive melting of the pellicle membrane 2 is caused and the melt of the resin adheres to the base plate 1 supporting the membrane 2 so that difficulties are encountered in washing and reuse of the base plate 1.

In the following, the improved method according to the present invention is illustrated in more detail by way of examples and comparative examples.

EXAMPLE

A 8% by weight solution of a tetrafluoroethylene-based co-polymer (Teflon AF 1600, a product by Du Pont Co.) in a fluorinated solvent (Florinert FC 75, a product by 3M Co.) was spread by using a spinner over the mirror-polished surface of a fused quartz glass plate having a diameter of 200 mm and a thickness of 3 mm followed by evaporation of the solvent to form a dried transparent film of the resin having a thickness of 1 $\mu$m. A pellicle frame made from an aluminum alloy having outer dimensions of 100 mm by 100 mm square and 5 mm height with a frame thickness of 4 mm was adhesively bonded to the resin film supported by the fused quartz glass plate by using an epoxy resin-based adhesive (Araldite Rapid, a product by Showa Kobunshi Co.).

Separately, a cutting device was prepared by bonding a wire of a nickel-chromium alloy having a diameter of 0.5 mm and provided with a coating layer of a ceramic insulating material on to the lower surface of a square frame made from stainless steel having an inside length of 100.5 mm a side and the terminals of the nickel-chromium alloy wire were connected to a DC power supply.

The above prepared cutting device was put around the pellicle frame bonded to the resin film on the base plate so as to press the resin film with the wire under an overall load of 5 g and then the power source was turned on to heat the heater wire at 600° C. with a DC current of 1 ampere for 10 seconds.

The DC power source was turned off and the cutting device was removed from the pellicle frame to examine the trimmed edge of the pellicle membrane on the fused quartz glass plate. No cutting debris of the pellicle membrane formed by trimming was found on the base plate of fused quartz glass. The pellicle membrane bonded to the pellicle frame was peeled off from the base plate in water to finish a frame-supported pellicle having the trimmed membrane.

The fused quartz glass plate thus freed from the pellicle membrane was washed and examined with an optical microscope not to detect any damages or scratches. The pellicle membrane thus trimmed was also examined microscopically but no dust particles having a diameter of 1 $\mu$m or larger could be detected on the surface.

COMPARATIVE EXAMPLE

The procedure for the preparation of a frame-supported pellicle was substantially the same as in the Example described above excepting replacement of the cutting device by electric heating with a conventional trimming punch. The results of this test preparation was that a large number of scratches were found on the surface of the base plate of fused quartz glass after peeling of the pellicle membrane and deposition of a large number of dust particles having a diameter of 1 $\mu$m or larger were detected on the surface of the pellicle membrane peeled off from the base plate.

What is claimed is:

1. A process for trimming a pellicle membrane made from a thermoplastic resin supported on a base plate on which the membrane has been formed, and adhesively bonded to a pellicle frame comprising: providing a cutting device consisting of a cutter frame and a cutter element secured within the cutter frame wherein said cutter frame has having the same shape as the pellicle frame and has an inner area of a size substantially equal to an outer area of the pellicle frame so as to surround said pellicle frame, and wherein said cutter element is an electrically resistant wire capable of being electrically heated, heating the wire to a temperature higher than the melting point of the thermoplastic resin and contacting the heated wire with portions of the membrane protruding from the pellicle frame.

2. The process of claim 1 wherein the electrically resistant wire is platinum.

3. The process of claim 1 wherein the electrically resistant wire is an alloy of nickel-chromium.

* * * * *